United States Patent [19]

Sasaki

[11] 4,194,159
[45] Mar. 18, 1980

[54] ELECTRONIC TUNING SYSTEM

[75] Inventor: Tadao Sasaki, Yokohama, Japan

[73] Assignee: Sony Corporation, Tokyo, Japan

[21] Appl. No.: 897,394

[22] Filed: Apr. 18, 1978

[30] Foreign Application Priority Data

Apr. 21, 1977 [JP] Japan ............................ 52/46108

[51] Int. Cl.² ............................................ H04B 1/26
[52] U.S. Cl. ................................................ 455/179
[58] Field of Search ............... 325/453, 459, 464, 468, 325/420–422; 358/191; 334/11, 14, 15

[56] References Cited

U.S. PATENT DOCUMENTS

| 3,715,687 | 2/1973 | Solender | 325/453 |
| 4,142,157 | 2/1979 | Tanaka | 325/464 |
| 4,144,498 | 3/1979 | Tanaka | 325/464 |
| 4,152,654 | 5/1979 | Tanaka | 325/459 |

*Primary Examiner*—Marc E. Bookbinder

*Attorney, Agent, or Firm*—Lewis H. Eslinger; Alvin Sinderbrand

[57] ABSTRACT

Electronic tuning apparatus comprises an electronic tuner capable of tuning in a plurality of channels within a predetermined frequency range in response to a variable tuning signal, a device for selectively generating a channel selecting signal corresponding to a desired channel from among the plurality of channels, a storage device for storing a number of predetermined tuning values, said number being less than the total number of the plurality of channels and said storage device having an output to which the predetermined tuning values are selectively delivered, an operational processor for generating an actual tuning value for tuning to the desired channel in response to said channel selecting signal and the output of the storage device, and a device which receives the actual tuning value from the operational processor for supplying a corresponding tuning signal to the electronic tuner.

7 Claims, 4 Drawing Figures

ELECTRONIC TUNING SYSTEM

BACKGROUND OF THE INVENTION

1. Field of the Invention

This invention relates generally to electronic tuning apparatus, and is directed more particularly to a variable tuning signal generating circuit using a memory circuit.

2. Description of the Prior Art

In the prior art, it is known to use a storage means such as a digital memory circuit instead of a plurality of potentiometers for generating a tuning signal for an electronic tuner. However, in prior art systems, a memory circuit which has the ability to store a large number of predetermined tuning values is needed. For example, 50 predetermined tuning values must be stored in order to tune in the 50 UHF television channels available in Japan.

An example of a prior art tuning apparatus that uses a memory circuit will be described with reference to FIG. 1. For the sake of simplifying the explanation, only the tuning of UHF channels will be described.

In FIG. 1, 1 designates an electronic UHF tuner and 2 a video detecting circuit. The tuner 1 includes a local oscillator (not shown) which contains a variable reactance element, in this case a variable capacitance diode. This variable capacitance element is supplied with a tuning signal, voltage E which corresponds to a channel to be selected. Furthermore, a storage means, digital memory circuit 3 having 50 addresses, is provided. A predetermined tuning value, in the form of a binary code signal corresponding to the tuning voltage E is stored at each address. A channel selector 4 is provided whose output signal is used as the address signal for the memory circuit 3. This channel selector 4 produces a channel selecting signal in binary form corresponding to a selected channel. Thus, when a desired channel, for example, channel 13, is selected the channel selector 4 produces a channel selecting signal, for example, 000001, corresponding to the selected channel, and the memory circuit 3 is addressed by that channel selecting signal. As a result, a code signal, for example, 00000000010110, developed by the memory circuit 3 is fed to a digital-to-analog (D/A) converter 5, which then produces a tuning signal, voltage E, corresponding to the selected channel 13. This tuning voltage E is applied to the variable capacitance element of the local oscillator in the tuner 1. The channel selecting signal from the channel selector 4 is also fed to a channel display device 6, which then displays the selected channel 13.

With such a prior art tuning apparatus, a separate code signal corresponding to the tuning voltage E for each channel (from the channel 13 to channel 62) must be memorized in the memory circuit 3. The presetting operation of correctly determining and setting the binary code signals for each tuning apparatus is undesirably complicated and the storage capacity required by memory circuit 3 is undesirably large. Since the characteristics of the variable capacitance elements used in the local oscillator of the tuner 1 vary from tuner to tuner, the code signals must be determined and set, independently, for each channel in each tuning apparatus which is made. For example, in each Japanese UHF tuning apparatus, code signals corresponding to the tuning voltages E of 50 stations must each be preset in the memory circuit 3.

OBJECTS AND SUMMARY OF THE INVENTION

Accordingly, it is an object of this invention to provide an electronic tuning apparatus that avoids the above-described difficulties encountered with the prior art.

More particularly, it is an object of this invention to provide an electronic tuning apparatus which is easier to preset so as to compensate for its own individual tuning characteristics than electronic tuning apparatus in the prior art.

Another object is to provide an electronic tuning apparatus which requires less memory capacity to be used for the storage of preset tuning values than tuning apparatus in the prior art.

In accordance with an aspect of this invention, an electronic tuning apparatus comprises an electronic tuner capable of tuning in a plurality of channels within a predetermined frequency range in response to a variable tuning signal, a device for selectively generating a channel selecting signal corresponding to a desired channel from among said plurality of channels, a storage device for storing a number of predetermined tuning values, said number being less than the total number of said plurality of channels, said storage device having an output to which said predetermined tuning values are selectively delivered, an operational processor, receiving said channel selecting signal and the output of said storage device for generating an actual tuning value for said desired channel in response to said channel selecting signal and said output of the storage device, and a device receiving said actual tuning value from said operational processor for supplying a corresponding tuning signal to said electronic tuner. In a preferred embodiment of the invention the predetermined tuning values each correspond to a predetermined one of said plurality of channels and the operational processor generates the actual tuning values by means of interpolation. In such a preferred embodiment the electronic tuner includes a variable reactance element which changes is reactance in response to a variable tuning signal in the form of a variable tuning voltage. In the preferred embodiment, the predetermined tuning values are stored as digital values, the actual tuning values are generated as digital values, and the variable tuning signal is generated by a digital to analog converter.

The above and other object, features, and advantages of the invention will be apparent in the following detailed description of an illustrative embodiment of the invention which is to be read in conjunction with the accompanying drawings.

DESCRIPTION OF THE PREFERRED EMBODIMENT

An example of an electronic tuning apparatus according to the present invention will be now described with reference to the drawings.

Figure 1:
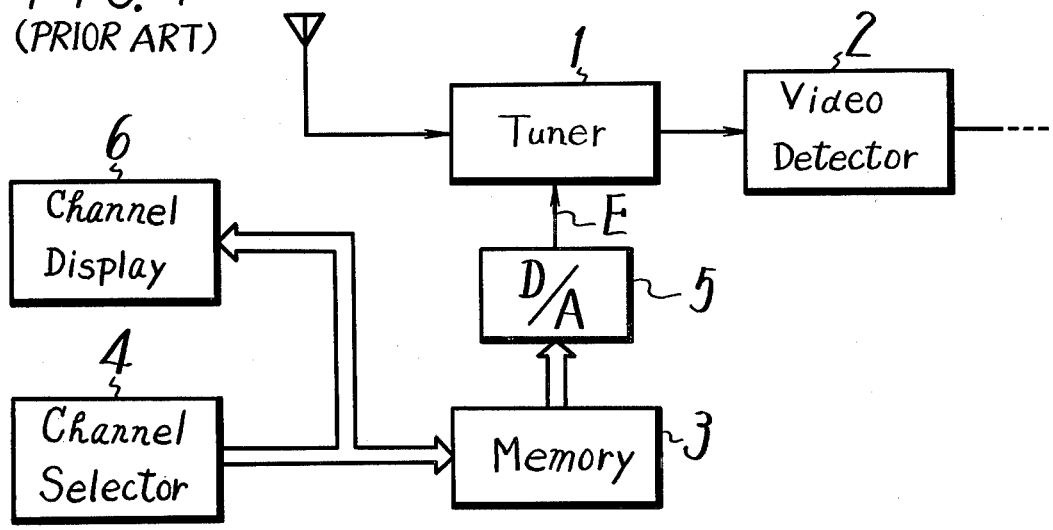
FIG. 1 is a systematic block diagram showing an example of a tuning apparatus of the prior art.
Figure 2:
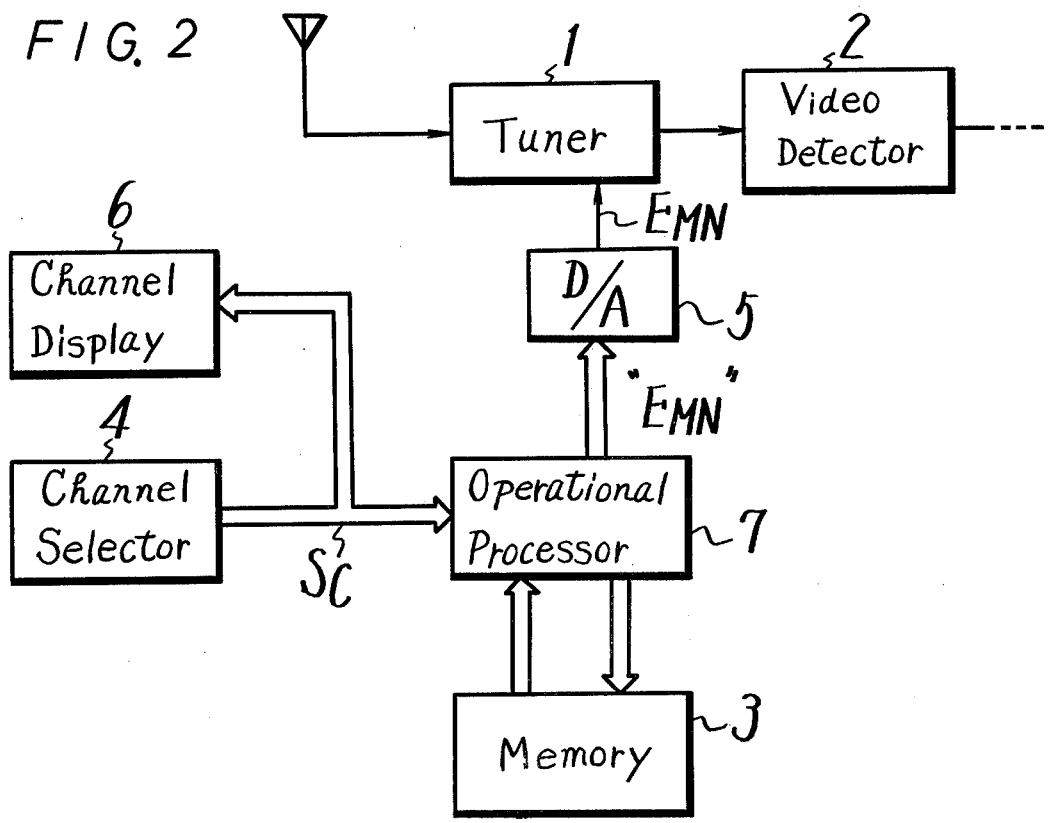
FIG. 2 is a systematic block diagram showing an example of an electronic tuning apparatus according to the present invention.

FIG. 2 is a block diagram showing an example of the present invention. Those elements shown in FIG. 2 which correspond to elements of FIG. 1 are marked with the same reference numberals in both Figures and their description will be omitted for the sake of brevity. In this invention an operational processing means 7 is provided in addition to the memory circuit 3 to produce a tuning signal voltage $E_{MN}$ and the number of predetermined tuning values stored in memory circuit 3 is less than the total number of channels the tuning apparatus is capable of tuning. With the present invention, when a desired channel is selected, the predetermined tuning value corresponding to the desired channel is not supplied directly from the memory circuit 3 D/A converter 5. Instead an actual tuning value, EMN, corresponding to the desired channel is generated and supplied to the D/A converter 5 by the operational processing means 7 in response to the channel selecting signal and the output of the memory circuit 3 which is supplied to operational processing means 7.

Figure 3:
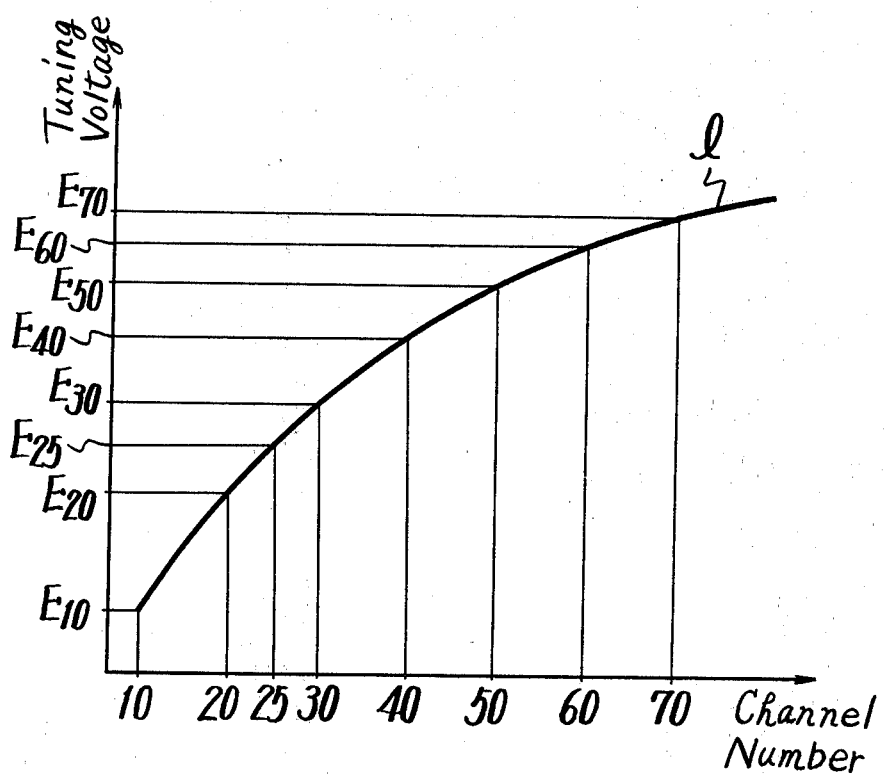
FIG. 3 is a graph showing the characteristic of a conventional variable capacitance diode.

Now, referring to FIG. 3, a description will be given of the predetermined tuning values which are stored in the memory circuit 3. In the graph of FIG. 3, a curve l represents the characteristics of a variable capacitance diode used in the local oscillator of the electronic tuner 1. In Japan, the UHF spectrum includes 50 channels, channels 13 to 62,. In the embodiment of the present invention shown, only seven binary predetermined tuning values are stored in the memory circuit 3, each corresponding to one of seven predetermined UHF channels, channels 10, 20, 30, 40, 50, 60 and 70. In practice, UHF channels lower than the channel 13 and higher than the channel 62 are not present, but in this example the channels 10 and 70 are assumed for the sake of simplicity.

When the characteristic of the variable capacitance diode is represented by the curve l as in the graph of FIG. 3, the actual tuning values, "$E_{MN}$" corresponding to tuning voltage $E_{MN}$ required for receiving the above predetermined channels (10, 20, 30, . . . 70) are $E_{10}$, . . . $E_{70}$ as shown in the graph of FIG. 3. Only seven predetermined tuning values, each corresponding to one of the predetermined channels are memorized in the memory circuit 3. When one of the predetermined channels are selected, a corresponding one of the above predetermined tuning value is produced as an actual tuning value.

Figure 4:
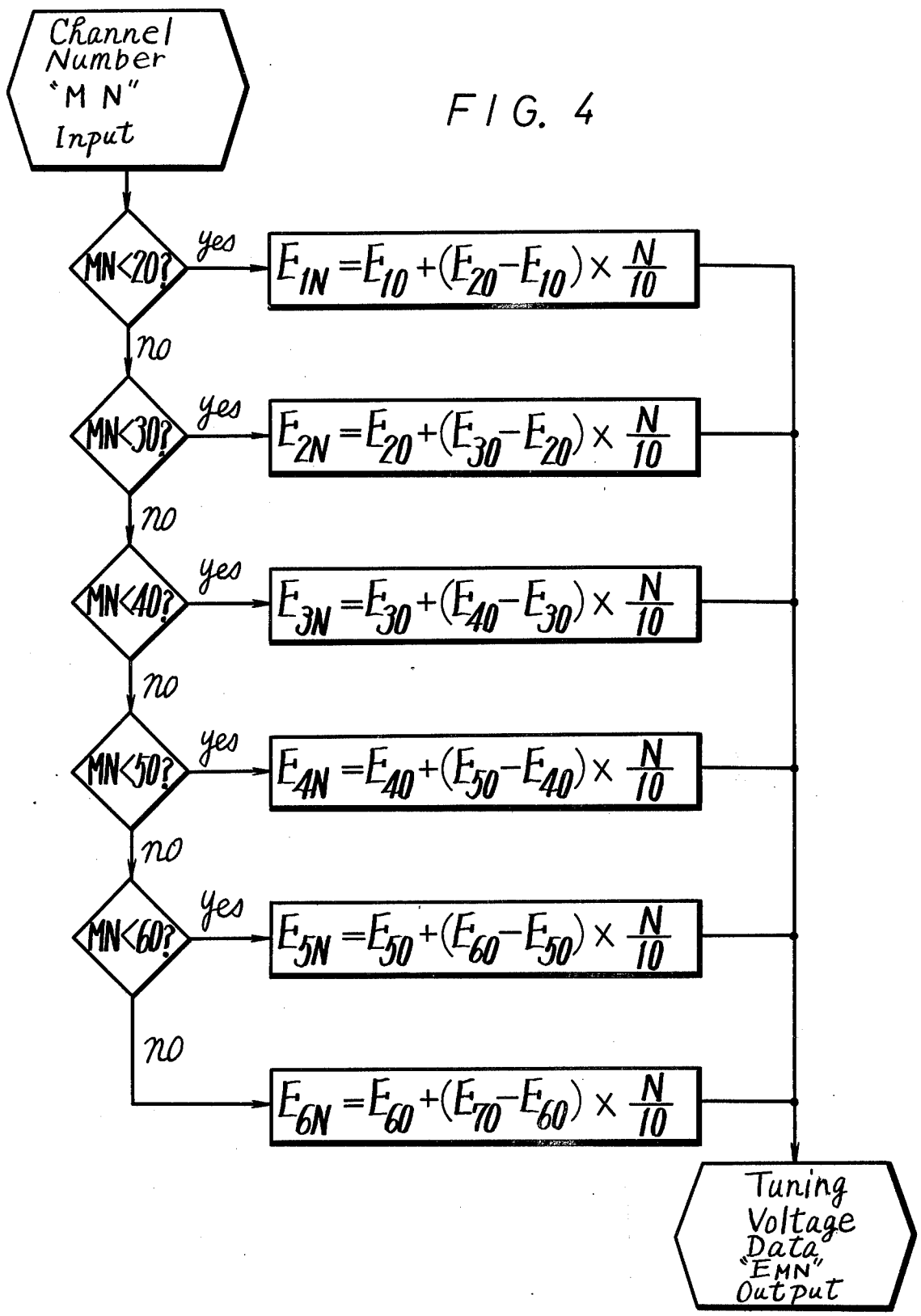
FIG. 4 is a flow chart used for explaining the operation of the operational processing means used in the example of the invention shown in FIG. 2.

When a channel other than one of the predetermined channels, for example, the channel 25, is selected, an actual tuning value "$E_{MN}$" is generated by the operational processing means, or circuit, as follows. When a desired channel is selected, the channel selector 4 produces a channel selecting signal $S_c$ corresponding to the selected desired channel. The channel selecting signal $S_c$ from the channel selector 4 is fed to the channel display device 6 for displaying the selected channel thereon and also to the operational processing circuit 7. The channel selecting signal $S_c$ associated with each selected channel corresponds to a channel number MN (where the letter M represents the number of tens and the letter N represents the number of units). The operational processing circuit 7 has the discriminating and calculating funtions shown in the flow chart of FIG. 4. That is, when a channel selecting signal $S_c$ corresponding to a desired channel number MN is applied to the operational processing circuit 7, it responds to the value of the channel number MN and generates an actual tuning value "$E_{MN}$" according to the general formula $$"E_{MN}" = "E_{MO}" + ("E_{MO+10}" - "E_{MO}") \times N/10$$

to produce an actual tuning value "$E_{MN}$" in the form of a binary code. This actual tuning value "$E_{MN}$" is fed to the D-A converter 5 so as to produce the corresponding tuning signal, in this case DC tuning voltage $E_{MN}$. In making this calculation, the operational processing circuit 7 addresses the memory circuit 3 so as to obtain from the output of that memory circuit the predetermined tuning values "$E_{MO}$" and "$E_{MO+10}$".

If, for example, the channel selecting signal corresponding to channel 25 is applied to the operational processing circuit 7, since M=2 and N=5, the approximate formula for producing the actual tuning value "$E_{25}$" corresponding to the channel 25 becomes as follows:

$$"E_{25}" = "E_{20}" + ("E_{30}" - "E_{20}") \times 5/10$$

The above formula is calculated by the operational processing circuit 7 to produce the actual tuning value "$E_{25}$", which is then converted into a tuning signal, voltage $E_{25}$, by D/A converter 5.

As described above, according to the present invention, the number of predetermined tuning values which must be stored in the memory circuit 3 is smaller than the number of channels which can be received, and tuning signals corresponding to channels other than those for which predetermined tuning values have been stored are generated by interpolation. As a result, the present invention has the following features as compared with the prior art.

(1) The number of channels for which predetermined tuning values must be ascertained and preset can be reduced. As a result, the effort required to preset tuning apparatus embodying the present invention is greatly reduced. This is a major advantage, since in many tuning apparatuses the variable capacitance diodes used have different response curves, and hence predetermined tuning values must be ascertained and preset separately for each tuning apparatus.

(2) The memory capacity required by the memory circuit 3 can be greatly reduced.

(3) Tuning apparatus of the prior art can easily be modified to embody the present invention.

In the example of the invention illustrated and described above, predetermined tuning values are preset for every 10 channels, but it will be apparent that the distance between such preset or predetermined channels and the number of such channels can vary considerably.

In order to simplify the explanation, only the UHF tuner is explained in the above description, but the present invention can be similarly applied to a VHF-UHF combination tuner.

Further, in the embodiment of the invention described above a linear approximation is employed, but the present invention can similarly employ a curved approximation.

Having described a specific preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

I claim as my invention:

1. An electronic tuning apparatus comprising:
    an electronic tuner capable of tuning in a plurality of channels within a predetermined frequency range in response to a variable tuning signal;
    means for selectively generating a channel selecting signal corresponding to a desired channel from among said plurality of channels;
    storage means for storing a number of predetermined tuning values each corresponding to a predetermined frequency, said number being less than the total number of said plurality of channels, said storage means having an output to which said predetermined tuning values are selectively delivered;
    operational processing means receiving said channel selecting signal and the output of said storage means for generating an actual tuning value for said desired channel in response to said channel selecting signal and at least two of said predetermined tuning values delivered to said operational processing means by said output of the storage means; and
    means receiving said actual tuning value from said operational processing means for supplying a corresponding tuning signal to said electronic tuner.

2. An electronic tuning apparatus according to claim 1; wherein said predetermined tuning values each correspond to a predetermined one of said plurality of channels.

3. An electronic tuning apparatus according to claim 2; wherein said operational processing means generates said actual tuning value by means of interpolation.

4. An electronic tuning apparatus according to claim 1; wherein said electronic tuner includes a variable reactance element, the reactance of which varies in response to said variable tuning signal.

5. An electronic tuning apparatus according to claim 4; wherein said storage means stores said number of predetermined tuning values as digital values, said operational processing means generates said actual tuning value as a digital value, and said means for supplying said tuning signal to said electronic tuner includes a digital-to-analog converter.

6. An electronic tuning apparatus according to claim 4; wherein said means for supplying a variable tuning signal to said electronic tuner supplies a variable voltage to said variable reactance element.

7. An electronic tuning apparatus comprising:
    an electronic tuner capable of tuning in a plurality of channels within a predetermined frequency range, and which has a variable reactance element;
    means for generating a channel selecting signal;
    means for storing a plurality of predetermined tuning values, each of said tuning values corresponding to a predetermined one of said channels with the total number of said tuning values being less than the total number of said plurality of channels;
    operational processing means for generating an actual tuning value corresponding to one of said channels as a function of said channel selecting signal and at least two of said predetermined tuning values, and
    means including a digital-to-analog converter for receiving said actual tuning value from said operational processing means and for supplying a corresponding tuning voltage to said variable reactance element.

* * * * *